(12) United States Patent
Wang et al.

(10) Patent No.: US 8,183,650 B2
(45) Date of Patent: May 22, 2012

(54) MEMS DEVICE AND MEMS SPRING ELEMENT

(75) Inventors: Chuan-Wei Wang, Hsinchu (TW); Sheng-Ta Lee, Hsinchu (TW); Hsin-Hui Hsu, Hsinchu (TW)

(73) Assignee: PixArt Imaging Inc., Hsinchu (TW)

( * ) Notice: Subject to any disclaimer, the term of this patent is extended or adjusted under 35 U.S.C. 154(b) by 232 days.

(21) Appl. No.: 12/756,305

(22) Filed: Apr. 8, 2010

(65) Prior Publication Data

US 2011/0024852 A1 Feb. 3, 2011

(30) Foreign Application Priority Data

Jul. 29, 2009 (CN) .............................. 98213909 U

(51) Int. Cl.
*H01L 21/02* (2006.01)

(52) U.S. Cl. ........ 257/415; 257/226; 257/444; 257/734; 257/E23.106; 257/E27.112

(58) Field of Classification Search .................. 257/226, 257/415, 444, 734, E21.531, 23.106, 142, 257/27.112
See application file for complete search history.

(56) References Cited

U.S. PATENT DOCUMENTS

| | | | | |
|---|---|---|---|---|
| 5,417,235 A * | 5/1995 | Wise et al. | ......................... | 137/1 |
| 5,610,335 A * | 3/1997 | Shaw et al. | ................ | 73/514.36 |
| 5,865,417 A * | 2/1999 | Harris et al. | ..................... | 251/11 |
| 5,964,242 A * | 10/1999 | Slocum | ......................... | 137/240 |
| 6,267,605 B1 * | 7/2001 | Biegelsen | ......................... | 439/81 |
| 6,458,615 B1 | 10/2002 | Fedder et al. | | |
| 6,531,668 B1 * | 3/2003 | Ma | ................. | 200/181 |
| 6,746,891 B2 * | 6/2004 | Cunningham et al. | .......... | 438/52 |
| 6,819,820 B1 * | 11/2004 | Chaparala et al. | ............... | 385/17 |
| 6,838,304 B2 * | 1/2005 | Ikeda et al. | ..................... | 438/52 |
| 6,921,952 B2 | 7/2005 | Jeong | | |
| 7,247,035 B2 * | 7/2007 | Mok et al. | ........................ | 439/81 |
| 7,247,895 B2 * | 7/2007 | Liu et al. | ........................ | 257/226 |
| 7,315,161 B2 * | 1/2008 | Zribi et al. | ..................... | 324/126 |
| 7,322,242 B2 * | 1/2008 | Merassi et al. | ............. | 73/514.38 |
| 7,457,021 B2 * | 11/2008 | Desai | ......................... | 359/223.1 |
| 7,621,761 B2 * | 11/2009 | Mok et al. | ........................ | 439/81 |
| 8,008,105 B2 * | 8/2011 | Huang | ............................. | 438/52 |
| 8,026,120 B2 * | 9/2011 | Kihara et al. | ................... | 438/50 |

* cited by examiner

*Primary Examiner* — Michael Lebentritt
(74) *Attorney, Agent, or Firm* — Chun-Ming Shih

(57) ABSTRACT

A micro electromechanical system (MEMS) spring element is disposed on a substrate, and includes a fixing portion and a moveable portion. The fixing portion is fixed on the substrate, and includes an insulating layer, a plurality of metal-fixing layers and a plurality of supporting-fixing layers. The insulating layer is disposed on the substrate. The metal-fixing layers are disposed above the insulating layer. The supporting-fixing layers are connected between the metal-fixing layers. The moveable portion has a first end and a second end. The first end is connected with the fixing portion, and the second end is suspended above the substrate. The moveable portion includes a plurality of metal layers and at least a supporting layer. The supporting layer is connected between the adjacent metal layers, and a hollow region is formed between the supporting layer and the adjacent metal layers. The deformation of the MEMS spring element generated because of the different thermal expansion may be avoided and the working performance of the MEMS spring element can be improved.

12 Claims, 13 Drawing Sheets

MEMS DEVICE AND MEMS SPRING ELEMENT

This application claims priority to a Taiwan application No. 098213909 filed Jul. 29, 2009.

BACKGROUND

1. Technical Field

The present invention relates to a micro electromechanical system (MEMS) device, and more particularly to a MEMS device with at least a hollow region and a MEMS spring element with at least a hollow region.

2. Description of the Related Art

Micro electromechanical system (MEMS) technique has opened up a whole new technical field and industry. The MEMS technique has been widely used in inertial sensors, for example, accelerometers and gyroscopes. Generally, in these sensors, one end of a moveable structure of the sensor is fixed on a substrate by a MEMS spring element. As such, the moveable structure can has a reciprocating motion along a predetermined direction. The MEMS spring element is commonly made by stacking metal layers and oxide layers.

However, because thermal expansion coefficient of the metal layers is different from that of the oxide layers, the metal layers and the oxide layers will be thermally expanded to different degrees when a high-temperature manufacturing process of the MEMS spring element is carried out. Consequently, the MEMS spring element will be deformed, and thus and working performance of the MEMS spring element will be degraded.

What needed, therefore, is a new MEMS spring element and a new MEMS device that can overcome the above-mentioned shortcomings.

BRIEF SUMMARY

The present invention relates to a MEMS spring element that can maintain a predetermined contour even if the ambient temperature changes, therefore, the MEMS spring element has improved working performance.

The present invention also relates to a MEMS device that can avoid thermal deformation to affect working performance of the MEMS device.

The present invention provides a MEMS spring element disposed on a substrate. The MEMS spring element includes a fixing portion and a moveable portion. The fixing portion is fixed on the substrate, and includes an insulating layer, a plurality of metal-fixing layers and a plurality of supporting-fixing layers. The insulating layer is disposed on the substrate. The metal-fixing layers are disposed above the insulating layer. The supporting-fixing layers are connected between the metal-fixing layers. The moveable portion has a first end and a second end. The first end is connected with the fixing portion, and the second end is suspended above the substrate. The moveable portion includes a plurality of metal layers and at least one supporting layer. The supporting layer is connected between the adjacent metal layers, and a hollow region is formed between the supporting layer and the adjacent metal layers.

The present invention also provides a MEMS device disposed on a substrate. The MEMS device includes an insulating layer, a plurality of metal layers and at least one supporting layer. The insulating layer is disposed on the substrate. The metal layers are disposed on the insulating layer. The supporting layer is connected between the adjacent metal layers, and at least a hollow region is formed between the supporting layer and the adjacent metal layers.

In the MEMS device of the present invention, the hollow regions are formed between the supporting layers and the metal layers, and there are no other filling material between the supporting layers and the metal layers. Therefore, the moveable portion would not be deformed when the ambient temperature changes. Thus the MEMS device can maintain a good working performance.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

There are some embodiments described for instructing the MEMS device of the present invention, but the present invention is not limited thereto. It is known that the MEMS device of the present invention may be any MEMS device which can generate motion while be forced by external forces.

Figure 1:
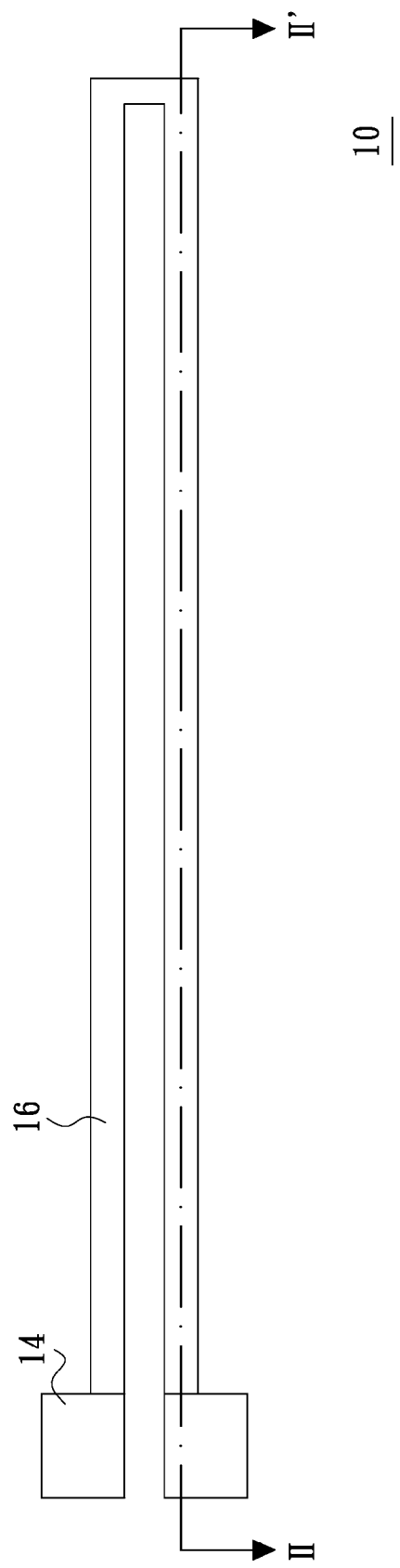
FIG. 1 is a schematic top-plan view of a MEMS spring element according to an embodiment of the present invention.
Figure 2:
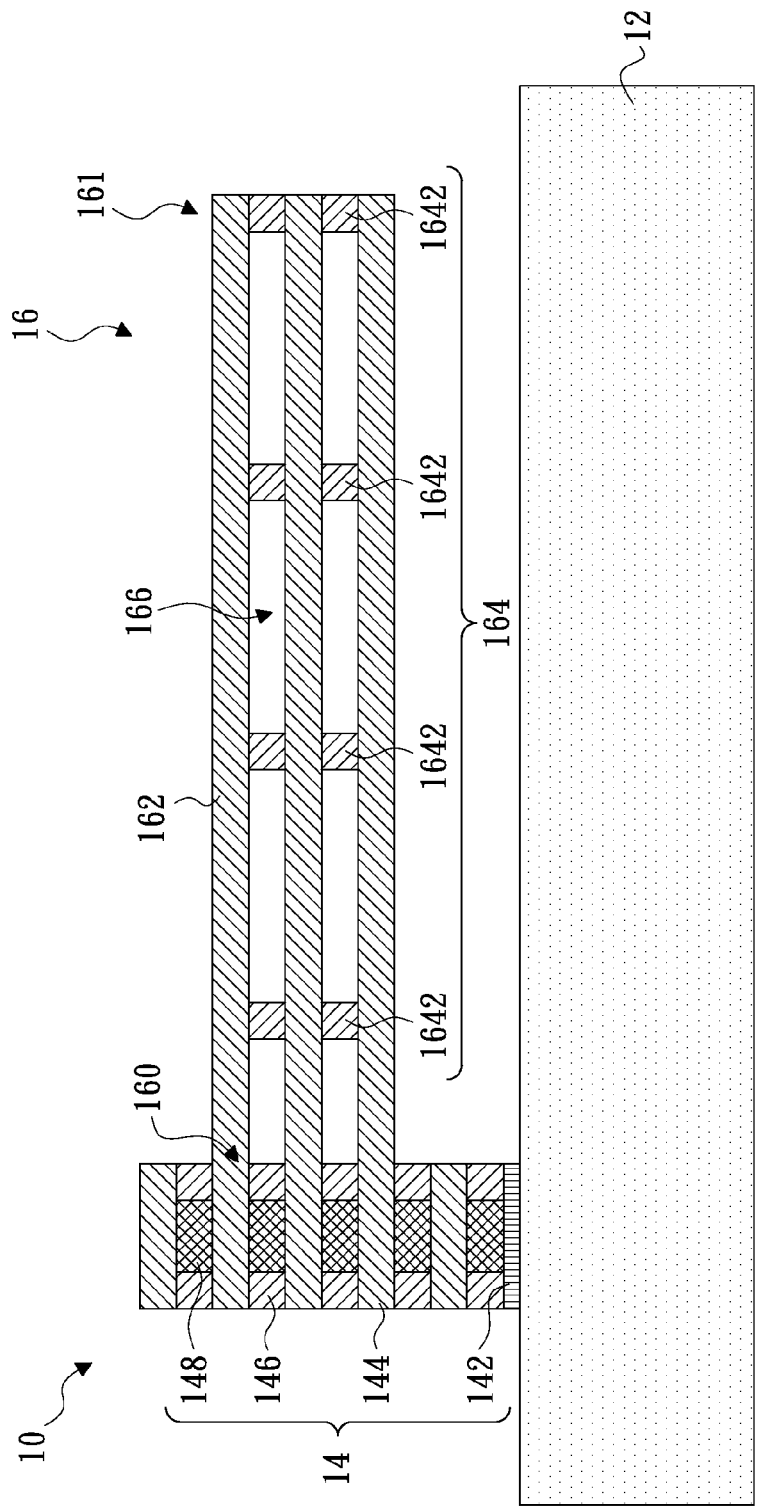
FIG. 2 is a schematic cross-sectional view of the MEMS spring element of FIG. 1, taken along line II-II' thereof.

FIG. 1 is a schematic top-plan view of a MEMS spring element according to an embodiment of the present invention. FIG. 2 is a schematic cross-sectional view of the MEMS spring element of FIG. 1, taken along line II-II' thereof. Referring to FIGS. 1 and 2, the MEMS spring element 10 is disposed on a substrate 12. The MEMS spring element 10 includes a fixing portion 14 and a moveable portion 16. The fixing portion 14 is fixed on the substrate 12. The fixing portion 14 includes an insulating layer 142, a plurality of metal-fixing layers 144 and a plurality of supporting-fixing layers 146. The insulating layer 142 is disposed on the substrate 12. The metal-fixing layers 144 are disposed above the insulating layer 142. The supporting-fixing layers 146 are connected between the metal-fixing layers 144 correspondingly. In addition, in this embodiment, the fixing portion 14 further includes a plurality of oxide layers 148. The oxide layers 148 are located between the adjacent metal-fixing layers 144, and the supporting-fixing layers 146 surround the oxide layers 148 correspondingly, so that the oxide layers 148 are sealed between the metal-fixing layers 144.

Referring to FIG. 2 again, the moveable portion 16 has a first end 160 and a second end 161. The first end 160 is connected with the fixing portion 14. The second end 161 is suspended above the substrate 12. The moveable portion 16 includes the metal layers 162 and the supporting layers 164. The supporting layers 164 are connected between the adjacent metal layers 162 correspondingly, and a hollow region 166 is formed between each supporting layer 164 and the adjacent metal layers 162 connected with the supporting layer 164.

In this embodiment, the moveable portion 16 consists of three metal layers 162 and two supporting layers 164. It should be pointed out that, the present invention is not limited herein. For example, the moveable portion 16 can consist of two metal layers 162 and one supporting layer 164, or the moveable portion 16 can consist of more than three metal layers 162 and more than two supporting layers 164.

Particularly, the metal-fixing layers 144 of the fixing portion 14 and metal layers 162 of the moveable portion 16 can be formed in the same process. Similarly, the supporting-fixing layers 146 of the fixing portion 14 and supporting layers 164 of the moveable portion 16 can be formed in the same process. The metal layers 162 can be connected to the metal-fixing layers 144 correspondingly. Material of metal-fixing layers 144 can be same and/or similar to that of the metal layers 162, and for example, the material is aluminum. Material of supporting-fixing layers 146 can be same and/or similar to that of the supporting layers 164, and for example, the material is tungsten.

Figure 3:
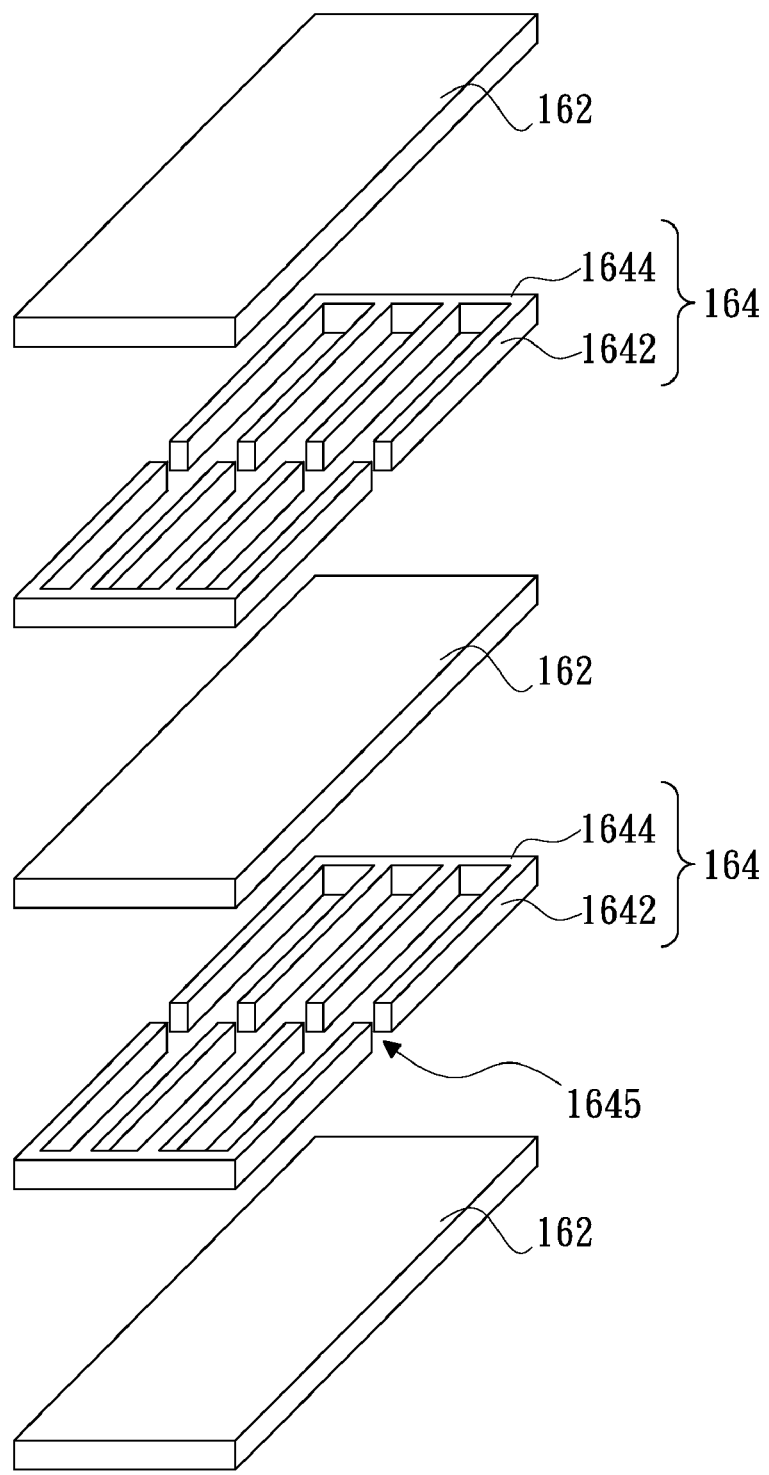
FIG. 3 is a schematic view of a moveable portion of the MEMS spring element of FIG. 2.

In details, in this embodiment, each of the metal layers 162 is continuous, and each of the supporting layers 164 includes a plurality of supporting units 1642 spaced from each other and formed between the adjacent metal layers 162. In a described embodiment, ends of the supporting units 1642 are connected to connecting units 1644 correspondingly to make the supporting units 1642 connect in series, as shown in FIG. 3. As such, each of the supporting layers 164 becomes a comb-like structure.

As described above, in the moveable portion 16, the hollow regions 166 are formed between the supporting layers 164 and the metal layers 162, and there are no other filling material between the supporting layers 164 and the metal layers 162. Therefore, the moveable portion 16 would not be deformed when the ambient temperature changes (for example, in a packaging process of the moveable portion 16). Thus, the MEMS spring element 10 can have improved working performance.

Figure 4:
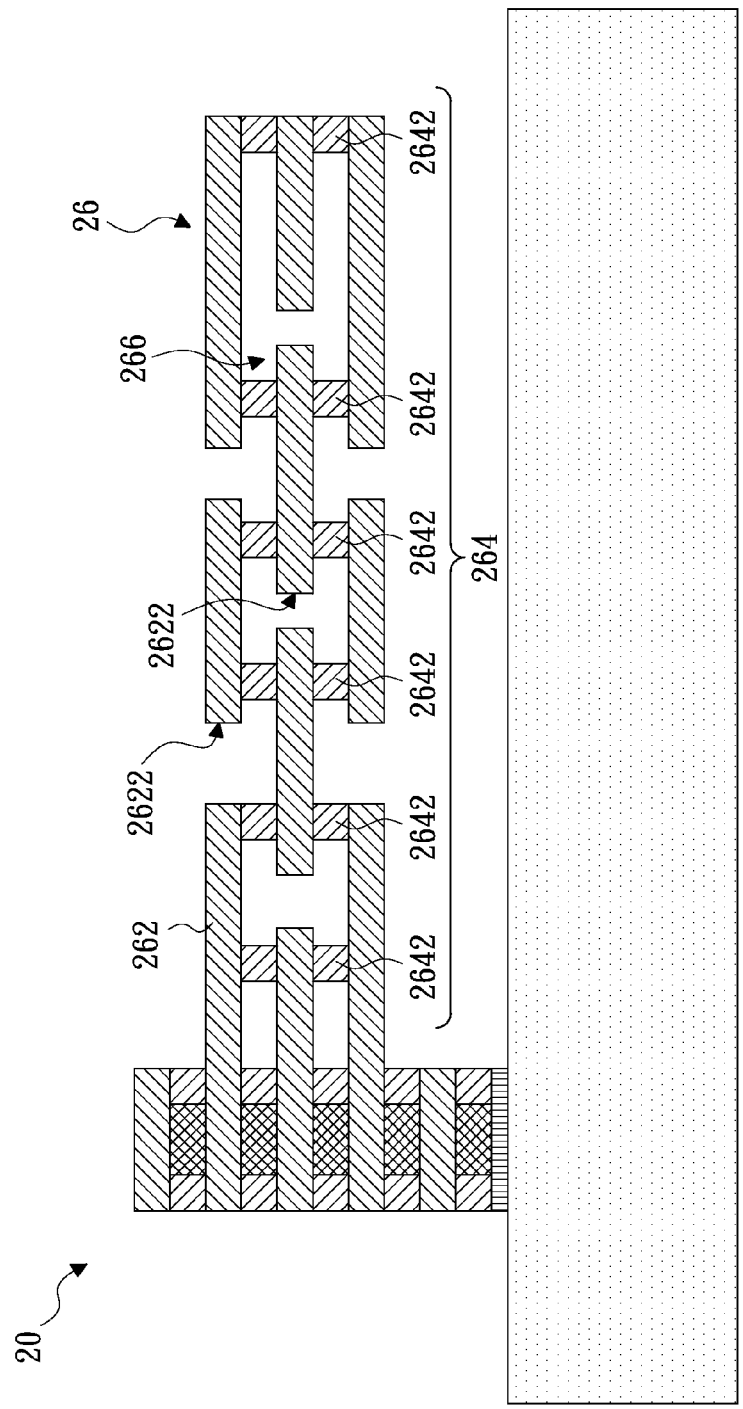
FIG. 4 is a schematic cross-sectional view of a MEMS spring element according to another embodiment of the present invention.
Figure 5:
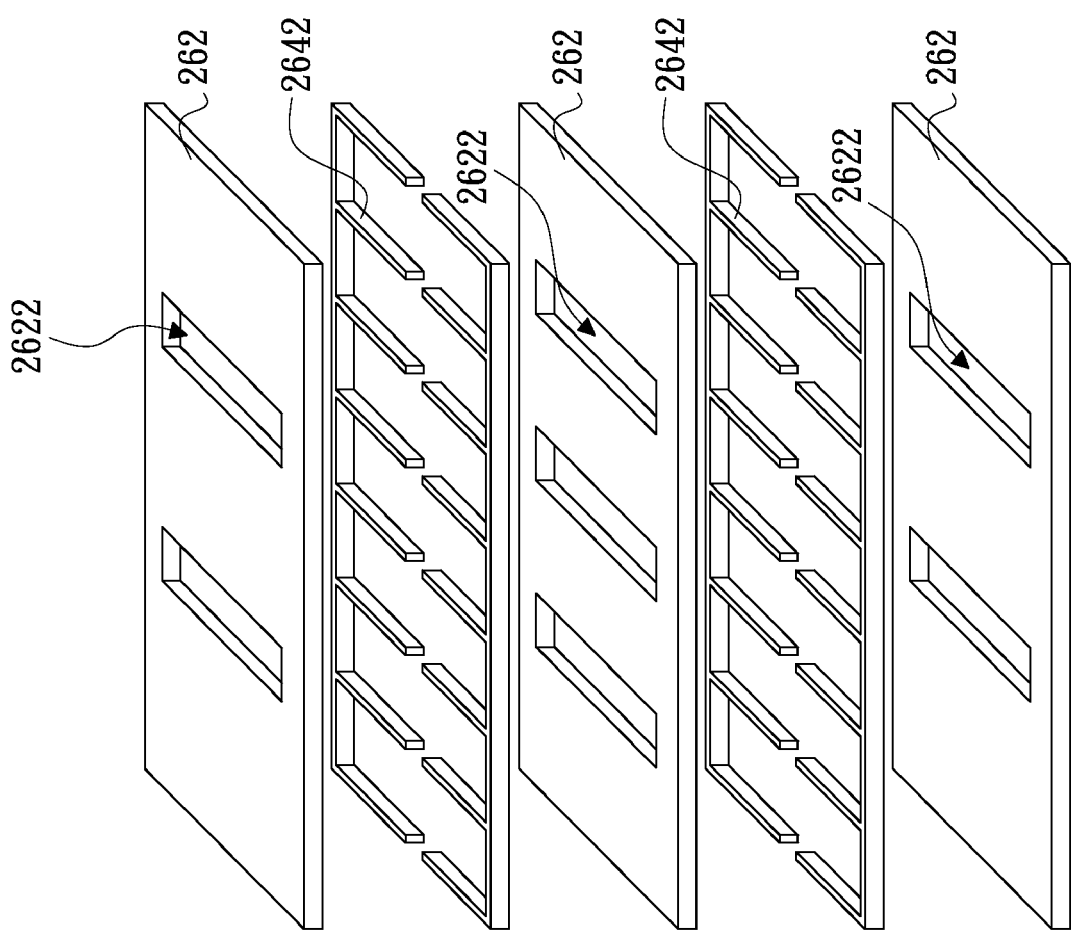
FIG. 5 is a schematic view of a moveable portion of the MEMS spring element of FIG. 4.

It should be pointed out that, the metal layers and the supporting layers of the MEMS spring element of the present invention can be other structures. Such as, referring to FIGS. 4 and 5, in a MEMS spring element 20, the metal layers 262 have openings 2622 to expose hollow regions 266. Furthermore, the hollow regions 266 in different levels can communicate with each other via the openings 2622. As such, in a process of making the MEMS spring element 20, etching gases can enter to remove redundant layers (generally, the redundant layers are oxides layers) between the metal layers 262 via the openings 2622 and some gaps between the supporting units 2642, therefore the hollow regions 266 can be formed in different levels. In particular, because the metal layers 262 have the openings 2622, rigidity of the metal layers 262 can be further decreased relative to that of the metal layers 162 with the continuous structure of FIG. 2. Therefore, the MEMS spring element 20 would have an improved flexibility. It should be understood that, according to the actual needs of flexibility, the skilled in the art can design the openings 2622 with the predetermined number, size, shape and position distribution, and the present invention is not limited herein.

Figure 6:
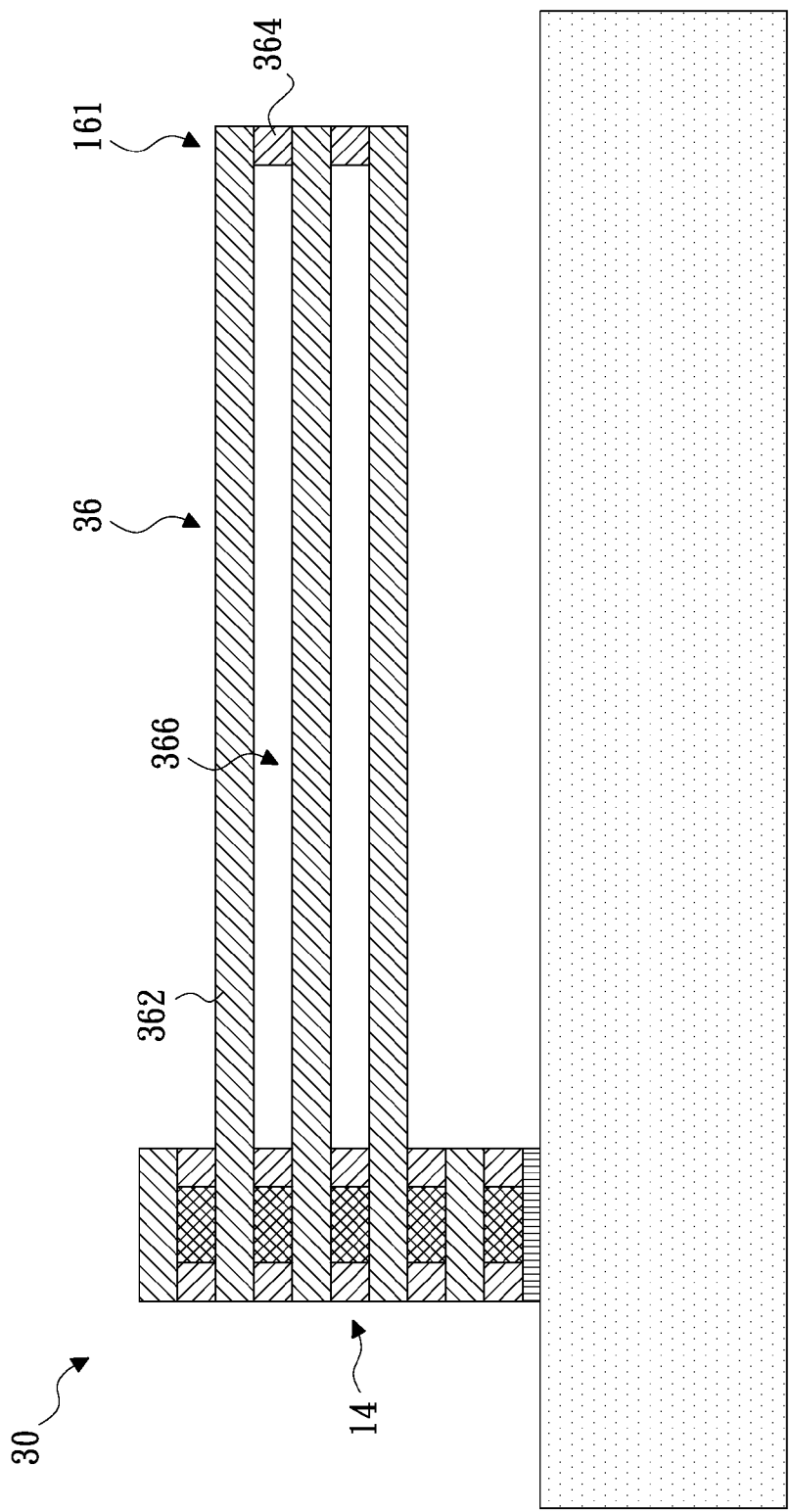
FIG. 6 is a schematic cross-sectional view of a MEMS spring element according to another embodiment of the present invention.
Figure 7:
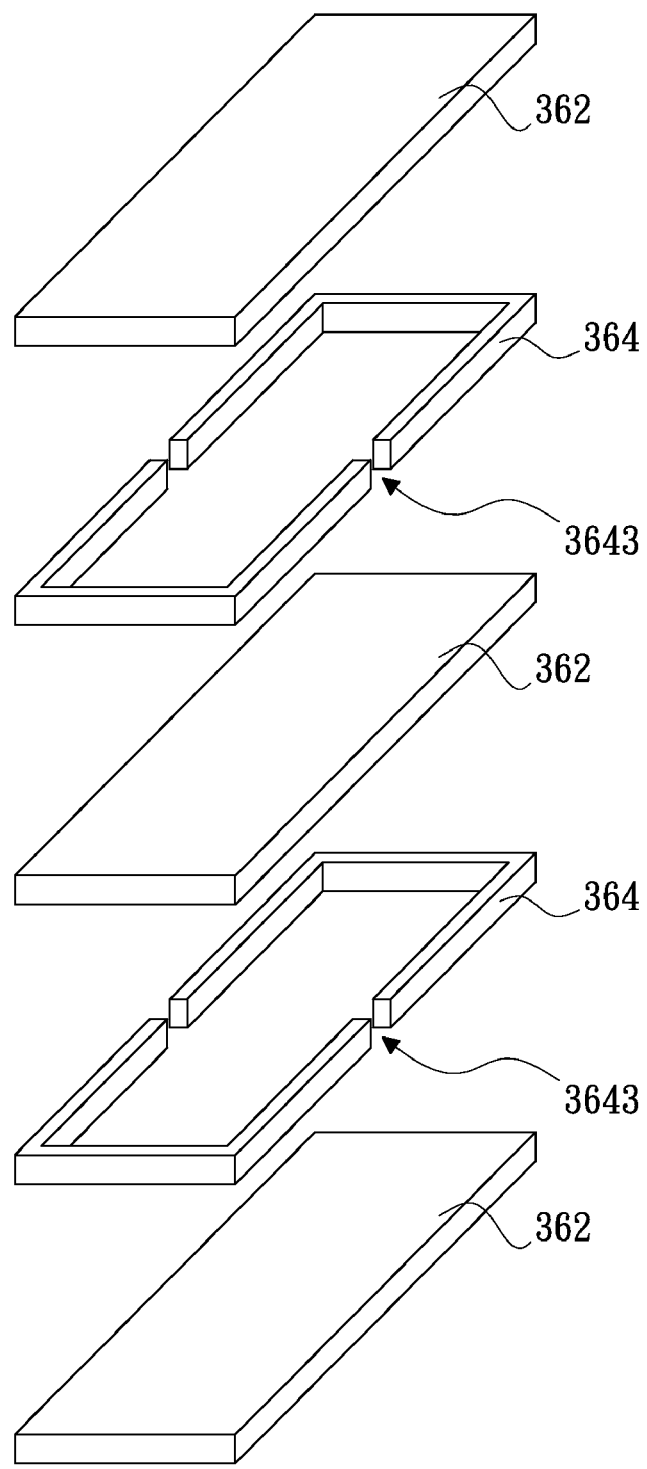
FIG. 7 is a schematic view of a moveable portion of the MEMS spring element of FIG. 6.

In the aforementioned embodiment, each of the supporting layers 164 includes the plurality of supporting units 1642, but the supporting layers of the present invention can be other structures. In another embodiment, referring to FIGS. 6 and 7, each supporting layer 364 is a loop in shape. Each supporting layer 364 surrounds at edges of between adjacent metal layers 362. Each supporting layer 364 can have at least one opening 3643. In this embodiment, in a process of making the MEMS spring element 30, etching gases can enter to remove redundant layers (generally, the redundant layers are oxides layers) between the metal layers 362 via the openings 3643, therefore the hollow regions 366 are formed.

Figure 8:
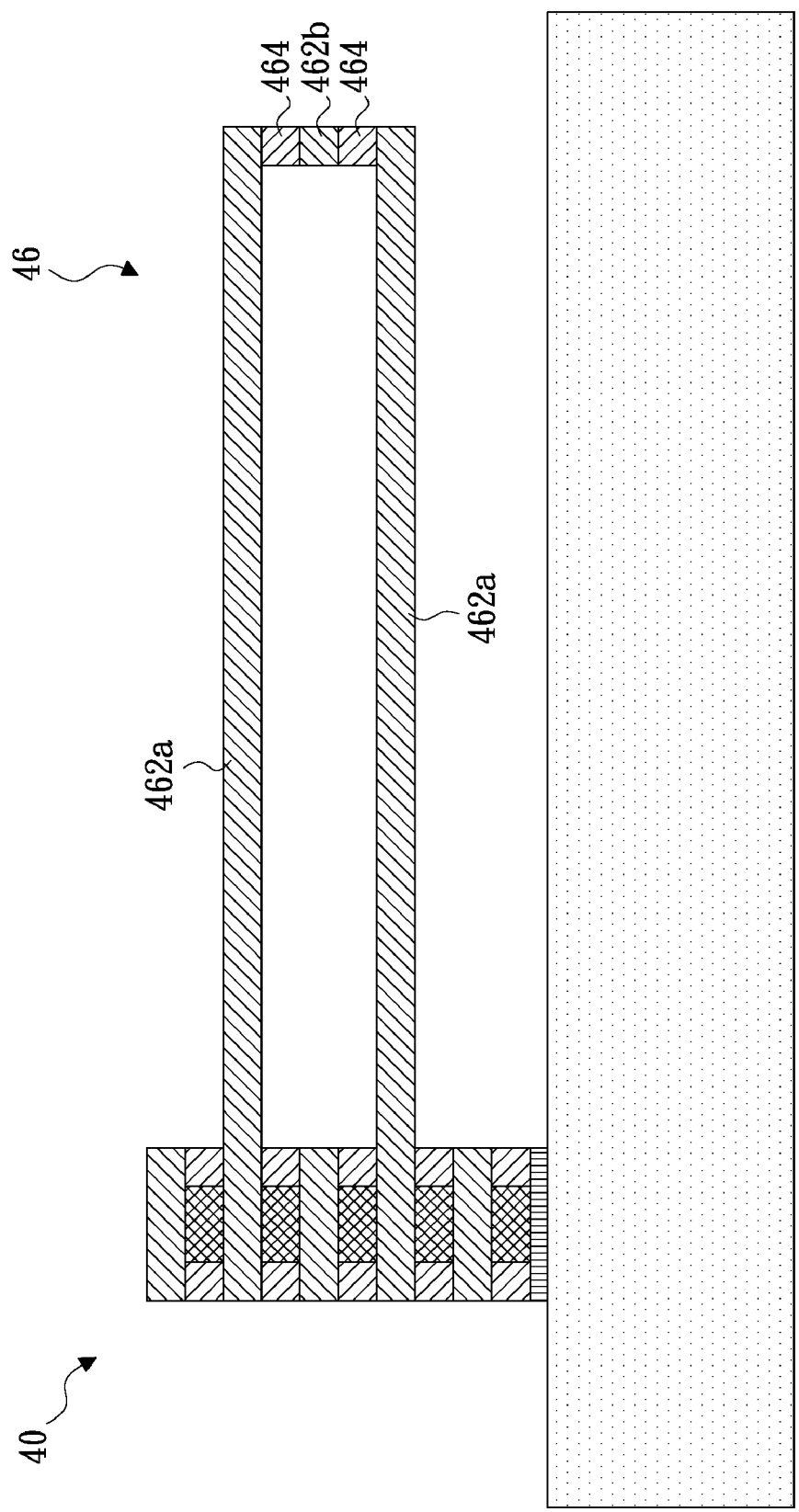
FIG. 8 is a schematic cross-sectional view of a MEMS spring element according to another embodiment of the present invention.
Figure 9:
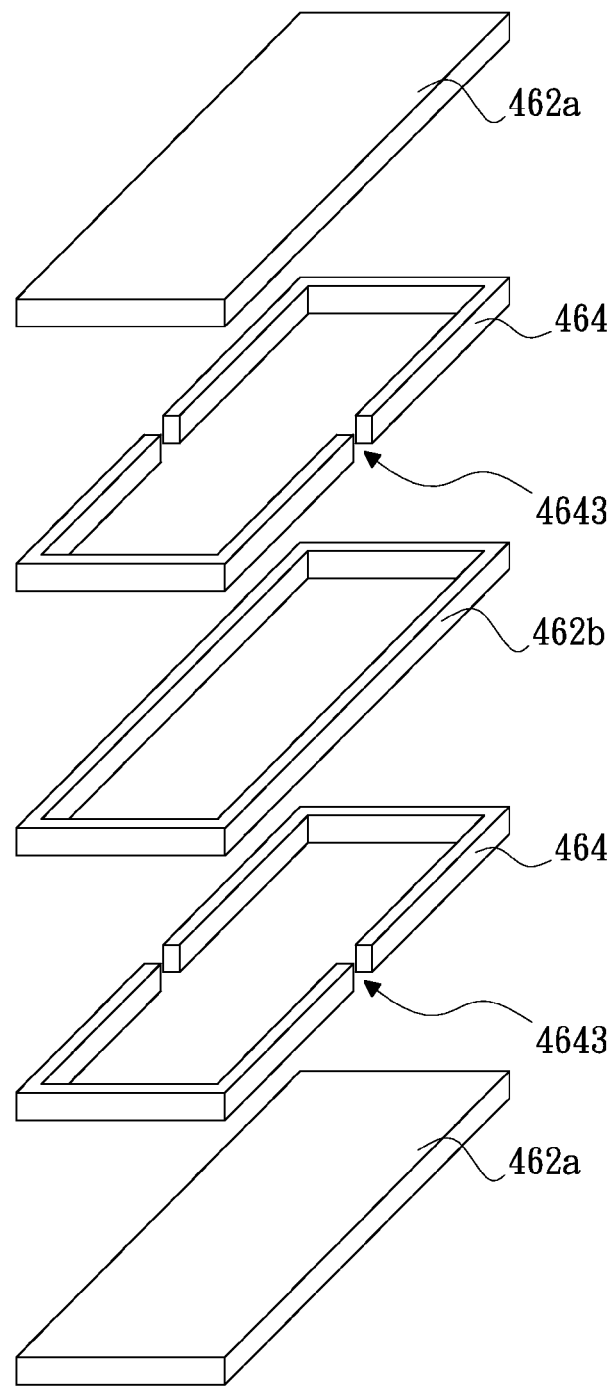
FIG. 9 is a schematic view of a moveable portion of the MEMS spring element of FIG. 8.

It should be pointed that, shapes of the metal layers of the MEMS spring element of the present invention can be the same or different. FIG. 8 is a schematic cross-sectional view of a MEMS spring element according to another embodiment of the present invention. FIG. 9 is a schematic view of a moveable portion of the MEMS spring element of FIG. 8. Referring to FIGS. 8 and 9, a moveable portion 46 of the MEMS spring element 40 includes a plurality of first metal layers 462a, a plurality of second metal layers 462b and a plurality of supporting layers 464. The second metal layers 462b and the supporting layers 464 are staggered between the first metal layers 462a. Shapes of the second metal layers 462b are similar to that of supporting layers 464. In details, the second metal layers 462b and the supporting layers 464 all surround at edges of between the first metal layers 462a. Each supporting layer 464 has at least one opening 4643. It should be understood that, if the supporting layers 464 are comb-like structures, the second metal layers 462b can also be comb-like structures corresponding to the supporting layers 464.

In a process of making the MEMS spring element 40, etching gases can enter to remove redundant layers (generally, the redundant layers are oxides layers) between the first metal layers 462a and the second metal layers 462b via the openings 4643.

Figure 10:
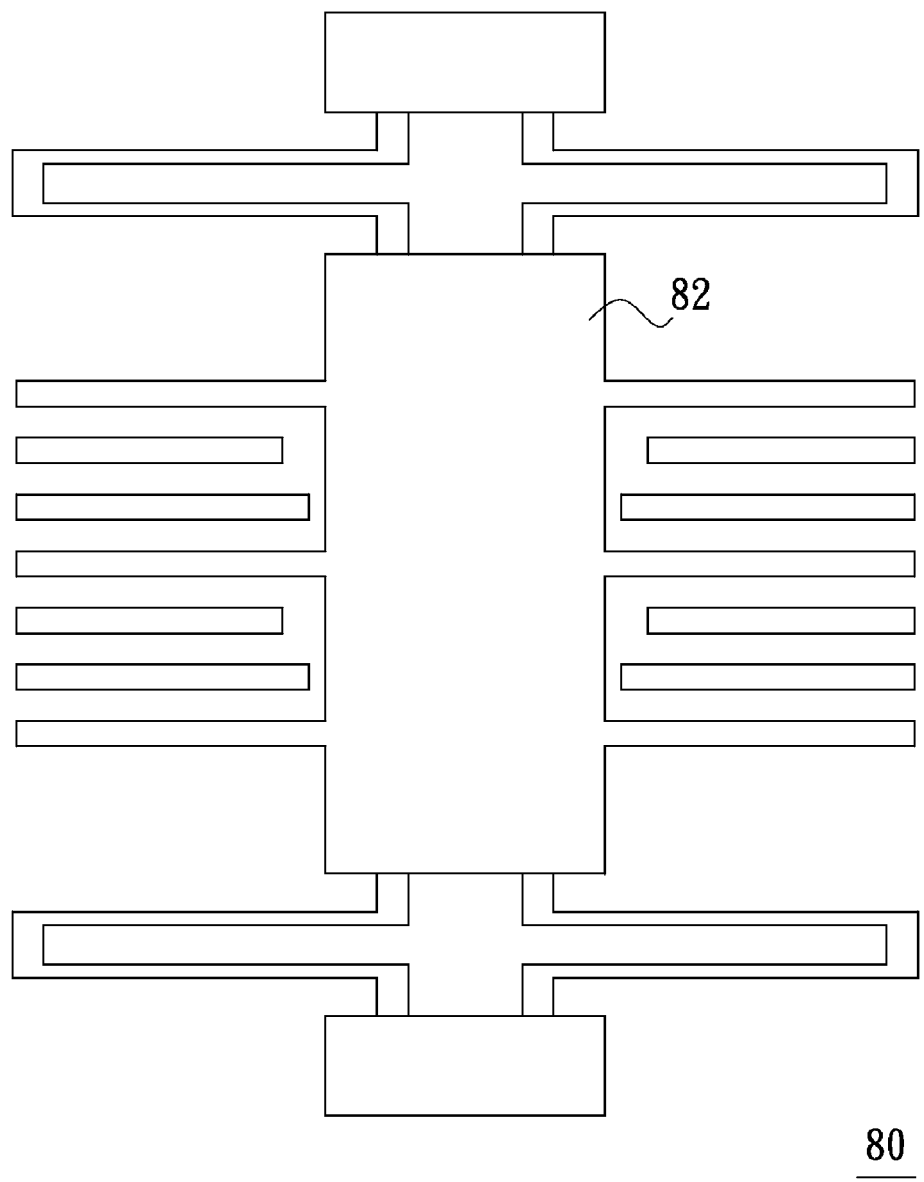
FIG. 10 is a schematic cross-sectional view of a MEMS accelerometer according to another embodiment of the present invention.

FIG. 10 is a schematic cross-sectional view of a MEMS accelerometer according to another embodiment of the present invention. Referring to FIG. 10, the moveable portion of the MEMS spring element of the above embodiments can also be used in a proof mass 82 of the MEMS accelerometer 80. In other words, in the MEMS accelerometer 80, the proof mass 82 has at least one hollow region. Therefore, the proof mass 82 may avoid uneven stress when operation temperature of the MEMS accelerometer 80 is changed. As such, sensitivity of the MEMS accelerometer 80 can be improved.

Figure 11A:
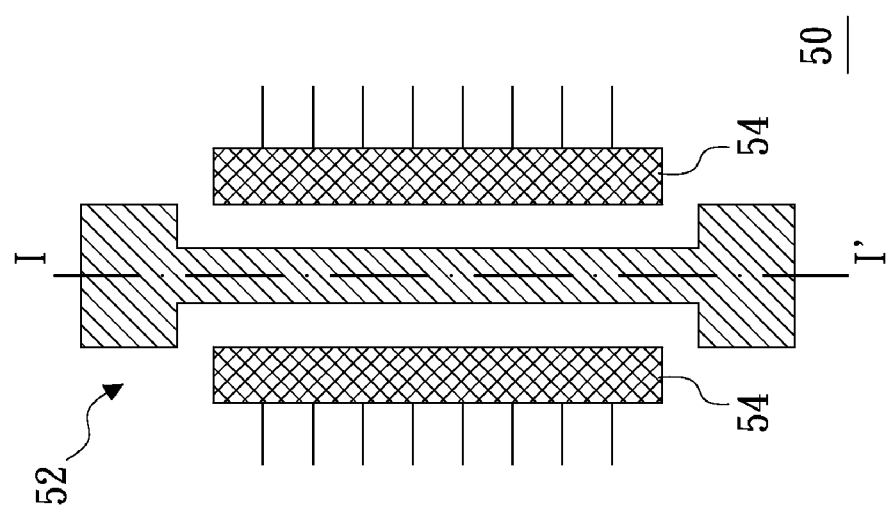
FIG. 11A is a schematic cross-sectional view of a MEMS resonator according to another embodiment of the present invention.

FIG. 11A is a schematic cross-sectional view of a MEMS resonator according to another embodiment of the present invention. Referring to FIG. 11, the MEMS resonator 50 is disposed on a substrate 51, and includes a moveable portion 52 and a plurality of fixing portions 54. The fixing portions 54 are located at two sides of the moveable portion 52. If electric voltage is applied on the fixing portions 54, an electric field would generate between the two sides of the moveable portion 52. Under the effect of the electric field, the moveable portion 52 can move to and fro between the fixing portions 54.

Figure 11B:
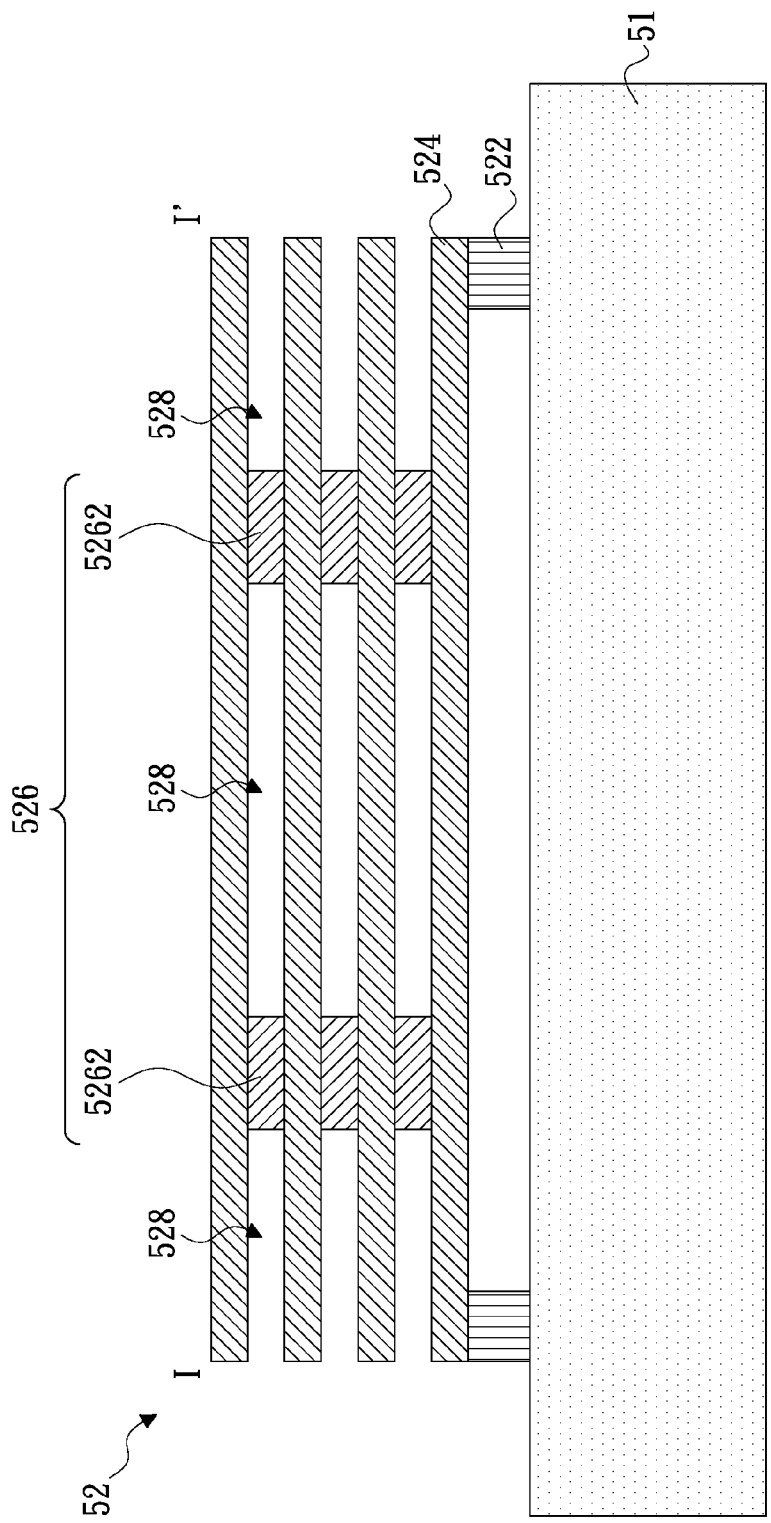
FIG. 11B is a schematic cross-sectional view of the MEMS resonator of FIG. 11A, taken along line I-I' thereof.

FIG. 11B is a schematic cross-sectional view of the MEMS resonator of FIG. 11A, taken along line I-I' thereof. Referring to FIG. 11B, the moveable portion 52 includes an insulating layer 522, a plurality of metal layers 524 and a plurality of supporting layers 526. The insulating layer 522 is disposed on the substrate 51. The metal layers 524 are disposed on the insulating layer 522. The supporting layers 526 are connected between the adjacent metal layers 524 correspondingly. Furthermore, a plurality of hollow regions 528 are formed between the supporting layers 526 and the metal layers 524. In this embodiment, each of the supporting layers 526 are made up of a plurality of supporting units 5262 spaced from each other. Material of metal layers 524 can be aluminum, and material of the supporting layers 526 can be tungsten.

As described above, in the moveable portion 52 of the MEMS resonator 50, the hollow regions 528 are formed between the supporting layers 526 and the metal layers 524. Therefore, the moveable portion 52 can avoid thermal deformation when ambient temperature changes. Thus the MEMS resonator 50 can maintain a good working performance, for example, a stable oscillation frequency.

Figure 12:
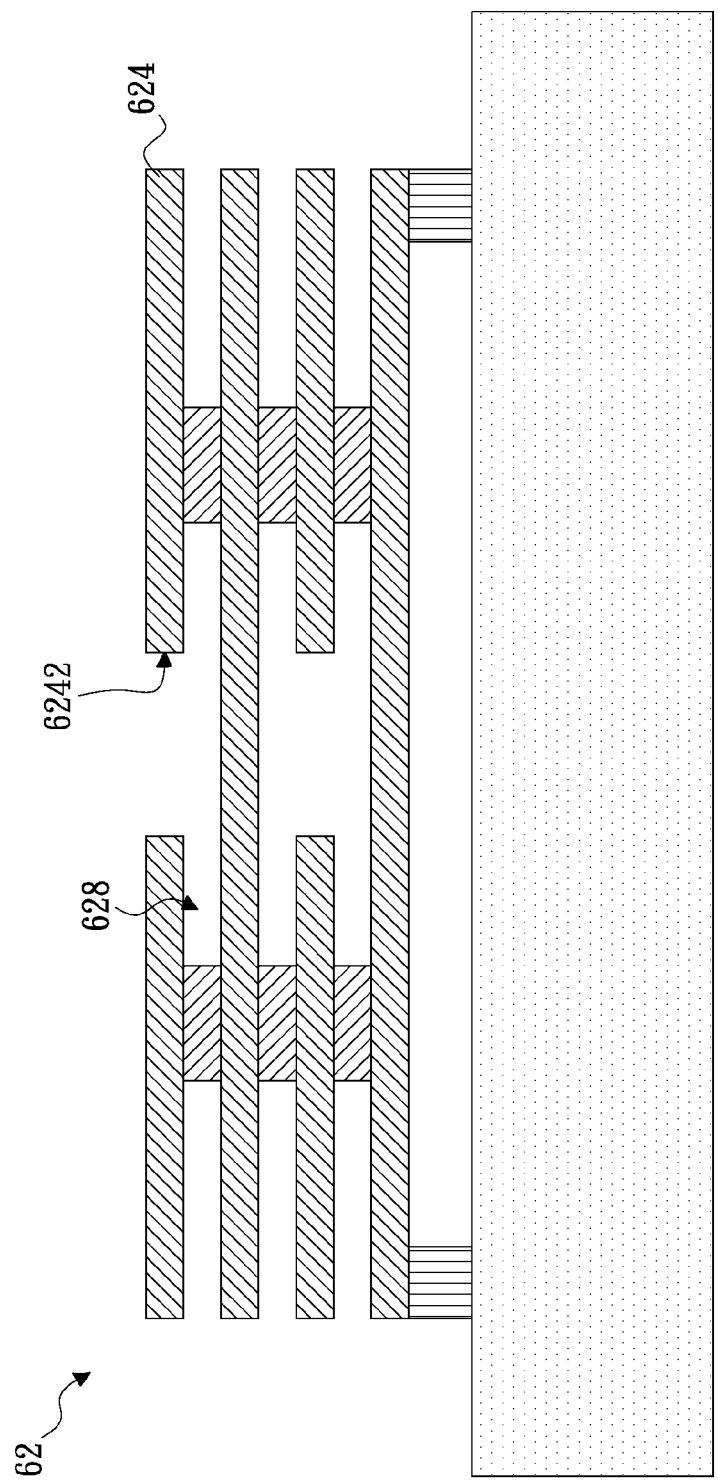
FIG. 12 is a schematic cross-sectional view of a moveable portion of a MEMS resonator according to another embodiment of the present invention.

FIG. 12 is a schematic cross-sectional view of a moveable portion of a MEMS resonator according to another embodiment of the present invention. Referring to FIG. 12, each metal layers 624 of a moveable portion 62 has an openings 6242 to expose a hollow region 628. In a process of making the moveable portion 62, etching gases can enter to remove redundant layers (generally, the redundant layers are oxides layers) between the metal layers 624 via the openings 6242, therefore the hollow regions 628 can be formed. In particular, because the metal layers 624 have the openings 6242, rigidity of the metal layers 624 can be further decreased relative to that of the metal layers 524 with the continuous structure of FIG. 11B. Therefore, the moveable portion 62 would have an improved flexibility. It should be understood that, according to the actual needs of flexibility, the skilled in the art can design the openings 6242 with the predetermined number, size, shape and position distribution, and the present invention is not limited herein.

In summary, in the MEMS device of the present invention, the hollow regions are formed between the supporting layers and the metal layers, and there are no other filling material between the supporting layers and the metal layers. Therefore, the moveable portion would not be deformed because of different thermal expansion coefficient between the metal layers and the redundant layers when the ambient temperature changes. Thus the MEMS device can maintain a good working performance.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A micro electromechanical system (MEMS) spring element disposed on a substrate, comprising:
    a fixing portion fixed on the substrate, the fixing portion comprising:
        an insulating layer disposed on the substrate;
        a plurality of metal-fixing layers disposed above the insulating layer; and
        a plurality of supporting-fixing layers connected between the metal-fixing layers; and
    a moveable portion having a first end and a second end, the first end connected with the fixing portion, the second end suspended above the substrate, the moveable portion including:
        a plurality of metal layers; and
        at least a supporting layer connected between the adjacent metal layers, and at least a hollow region formed between the supporting layer and the adjacent metal layers.

2. The MEMS spring element as claimed in claim 1, wherein at least one of the metal layers has at least an opening exposing the hollow region.

3. The MEMS spring element as claimed in claim 1, wherein the supporting layer comprises:
    a plurality of supporting units spaced from each other and formed between the adjacent metal layers; and
    a plurality of connecting units connected with two ends of the supporting units correspondingly, so as to make the supporting units connect in series.

4. The MEMS spring element as claimed in claim 3, wherein at least one of the supporting units has at least an opening exposing the hollow region.

5. The MEMS spring element as claimed in claim 1, wherein the supporting layer is a loop in shape, and has at least an opening exposing the hollow region.

6. The MEMS spring element as claimed in claim 1, wherein the fixing portion further comprises a plurality of oxide layers located between the adjacent metal-fixing layers and surrounded by the supporting-fixing layers correspondingly.

7. The MEMS spring element as claimed in claim 1, wherein the metal layers are connected with the metal-fixing layers correspondingly.

8. A micro electromechanical system (MEMS) device disposed on a substrate, comprising:
    an insulating layer disposed on the substrate;
    a plurality of metal layers disposed on the insulating layer; and
    at least an supporting layer connected between the adjacent metal layers, and at least a hollow region formed between the supporting layer and the adjacent metal layers.

9. The MEMS device as claimed in claim 8, wherein at least one of the metal layers has at least an opening exposing the hollow region.

10. The MEMS device as claimed in claim 8, wherein the supporting layer comprises:
    a plurality of supporting units spaced from each other and formed between the adjacent metal layers; and
    a plurality of connecting units connected with two ends of the supporting units correspondingly, so as to make the supporting units connect in series.

11. The MEMS device as claimed in claim 10, wherein at least one of the supporting units has at least an opening exposing the hollow region.

12. The MEMS device as claimed in claim 8, wherein the supporting layer is a loop in shape, and has at least an opening exposing the hollow region.

* * * * *